United States Patent
Brandon et al.

(10) Patent No.: US 10,734,198 B2
(45) Date of Patent: Aug. 4, 2020

(54) MICROWAVE PLASMA REACTOR FOR MANUFACTURING SYNTHETIC DIAMOND MATERIAL

(71) Applicant: ELEMENT SIX TECHNOLOGIES LIMITED, Didcot, Oxfordshire (GB)

(72) Inventors: John Robert Brandon, Didcot (GB); Ian Friel, Didcot (GB); Michael Andrew Cooper, Didcot (GB); Geoffrey Alan Scarsbrook, Didcot (GB); Ben Llewlyn Green, Didcot (GB)

(73) Assignee: Element Six Technologies Limited, Didcot, Oxfordshire (GB)

( * ) Notice: Subject to any disclaimer, the term of this patent is extended or adjusted under 35 U.S.C. 154(b) by 424 days.

(21) Appl. No.: 15/304,366

(22) PCT Filed: Jun. 10, 2015

(86) PCT No.: PCT/EP2015/062957
§ 371 (c)(1),
(2) Date: Oct. 14, 2016

(87) PCT Pub. No.: WO2015/193155
PCT Pub. Date: Dec. 23, 2015

(65) Prior Publication Data
US 2017/0040145 A1    Feb. 9, 2017

(30) Foreign Application Priority Data

Jun. 16, 2014 (GB) .................................. 1410703.1

(51) Int. Cl.
*H01J 37/32*    (2006.01)
*C30B 29/04*    (2006.01)
(Continued)

(52) U.S. Cl.
CPC ...... *H01J 37/32201* (2013.01); *C23C 16/274* (2013.01); *C23C 16/458* (2013.01);
(Continued)

(58) Field of Classification Search
USPC .............................. 118/723 MW; 156/345.41
See application file for complete search history.

(56) References Cited

U.S. PATENT DOCUMENTS 4,401,054 A * 8/1983 Matsuo ................. C23C 16/511
                                                                118/50.1
4,989,542 A    2/1991 Kamo
(Continued)

FOREIGN PATENT DOCUMENTS

EP    0432573 A2    6/1991
EP    0459177 A3    12/1991
(Continued)

OTHER PUBLICATIONS

English Machine Translation JO2004346385, Nagatsu (Year: 2004).*
(Continued)

*Primary Examiner* — Rakesh K Dhingra
(74) *Attorney, Agent, or Firm* — Dean W. Russell; Clark F. Weight; Kilpatrick Townsend & Stockton LLP (57) ABSTRACT

A microwave plasma reactor for manufacturing synthetic diamond material via chemical vapour deposition, the microwave plasma reactor comprising: a plasma chamber defining a resonant cavity for supporting a primary microwave resonance mode having a primary microwave resonance mode frequency f; a plurality of microwave sources coupled to the plasma chamber for generating and feeding microwaves having a total microwave power $P_T$ into the plasma chamber; a gas flow system for feeding process gases into the plasma chamber and removing them therefrom; and a substrate holder disposed in the plasma chamber
(Continued)

and comprising a supporting surface for supporting a substrate on which the synthetic diamond material is to be deposited in use, wherein the plurality of microwave sources are configured to couple at least 30% of the total microwave power Pτ into the plasma chamber in the primary microwave resonance mode frequency f, and wherein at least some of the plurality of microwave sources are solid state microwave sources.

15 Claims, 2 Drawing Sheets

(51) Int. Cl.
    C23C 16/27       (2006.01)
    C23C 16/511      (2006.01)
    C30B 25/10       (2006.01)
    C23C 16/458      (2006.01)
    C30B 25/20       (2006.01)

(52) U.S. Cl.
    CPC .......... C23C 16/511 (2013.01); C30B 25/105 (2013.01); C30B 25/205 (2013.01); C30B 29/04 (2013.01); H01J 37/3222 (2013.01); H01J 37/3244 (2013.01); H01J 37/32192 (2013.01); H01J 37/32247 (2013.01); H01J 37/32284 (2013.01); H01J 37/32293 (2013.01); H01J 37/32302 (2013.01); H01J 37/32715 (2013.01); H01J 2237/3321 (2013.01); H01J 2237/3323 (2013.01)

(56) References Cited

U.S. PATENT DOCUMENTS

| | | | | |
|---|---|---|---|---|
| 5,179,264 | A * | 1/1993 | Cuomo | H01J 37/32201 219/121.36 |
| 5,188,862 | A * | 2/1993 | Itatani | B23P 5/00 117/103 |
| 5,558,800 | A | 9/1996 | Page | |
| 5,626,922 | A * | 5/1997 | Miyanaga | C23C 16/26 427/249.15 |
| 5,736,818 | A * | 4/1998 | Ulczynski | H01J 37/32192 118/723 MW |
| 5,907,221 | A | 5/1999 | Sato et al. | |
| 5,961,776 | A * | 10/1999 | Sato | H01J 37/32192 156/345.41 |
| 6,158,384 | A | 12/2000 | Ye et al. | |
| 6,645,343 | B1 | 11/2003 | Wild et al. | |
| 7,574,974 | B2 | 8/2009 | Lagarde et al. | |
| 7,595,507 | B2 | 9/2009 | Francis et al. | |
| 8,283,189 | B2 | 10/2012 | Francis et al. | |
| 8,283,672 | B2 | 10/2012 | Francis et al. | |
| 2007/0108195 | A1 * | 5/2007 | Tian | B23K 13/01 219/702 |
| 2010/0015438 | A1 | 1/2010 | Williams et al. | |
| 2010/0074807 | A1 | 3/2010 | Bulkin et al. | |
| 2014/0197761 | A1 * | 7/2014 | Grandemenge | H01J 37/32009 315/502 |
| 2014/0230729 | A1 * | 8/2014 | Brandon | C23C 16/274 118/723 MW |

FOREIGN PATENT DOCUMENTS

| | | | |
|---|---|---|---|
| EP | 0503082 | A1 | 9/1992 |
| EP | 0801879 | B1 | 6/2002 |
| FR | 2974701 | A1 * | 11/2012 ........ H01J 37/32009 |
| GB | 2486782 | * | 6/2012 |
| GB | 2486782 | A | 6/2012 |
| JP | S63236791 | A | 10/1988 |
| JP | S6424094 | A | 1/1989 |
| JP | H03111577 | A | 5/1991 |
| JP | H03194893 | A | 8/1991 |
| JP | H04144992 | A | 5/1992 |
| JP | H04230019 | A | 8/1992 |
| JP | H06256952 | A | 9/1994 |
| JP | 2004-346385 | * | 12/2004 |
| JP | 2004346385 | A | 12/2004 |
| JP | 2007191362 | A | 8/2007 |
| JP | 2010525155 | A | 7/2010 |
| JP | 2014506292 | A | 3/2014 |
| RU | 2149521 | C1 | 5/2000 |
| RU | 2473720 | C2 | 1/2013 |
| WO | 2012008661 | A1 | 1/2012 |
| WO | 2012084655 | A2 | 6/2012 |
| WO | 2012084656 | A1 | 6/2012 |
| WO | 2012084657 | A1 | 6/2012 |
| WO | 2012084658 | A1 | 6/2012 |
| WO | 2012084659 | A2 | 6/2012 |
| WO | 2013087706 | A1 | 6/2013 |
| WO | 2013178535 | A2 | 12/2013 |

OTHER PUBLICATIONS

Nagatsu, M., et al., "Plasma CVD reactor with two microwave oscillators for diamond film synthesis," Thin Solid Films, May 26, 2006, pp. 617-621, vol. 506-507, Elsevier-Sequoia S.A., Lausanne, CH.

Balmer, R. S., et al., "Chemical vapour deposition synthetic diamond: materials, technology and applications," Journal of Physics Condensed Matter, Aug. 19, 2009, 23 Pages, vol. 21, No. 36, 364221, IOP Publishing Ltd, United Kingdom.

Silva, F., et al., "Microwave engineering of plasma-assisted CVD reactors for diamond deposition," Journal of Physics Condensed Matter, Aug. 19, 2009, vol. 21, No. 36, 364202, IOP Publishing Ltd, United Kingdom.

International Patent Application No. PCT/EP2015/062957, International Search Report and Written Opinion dated Jul. 27, 2015, 12 pages.

United Kingdom Patent Application No. GB1410703.1, Combined Search and Examination Report dated Mar. 5, 2015, 5 pages.

* cited by examiner

MICROWAVE PLASMA REACTOR FOR MANUFACTURING SYNTHETIC DIAMOND MATERIAL

CROSS REFERENCE TO RELATED APPLICATIONS

This application is the U.S. national phase of International Application No. PCT/EP2015/062957 filed on Jun. 10, 2015, and published in English on Dec. 23, 2015 as International Publication No. WO 2015/193155 A1, which application claims priority to United Kingdom Patent Application No. 1410703.1 filed on Jun. 16, 2014, the contents of all of which are incorporated herein by reference.

FIELD OF INVENTION

The present invention relates to a microwave plasma reactor for manufacturing synthetic diamond material using chemical vapour deposition techniques.

BACKGROUND OF INVENTION

Chemical vapour deposition (CVD) processes for synthesis of diamond material are now well known in the art. Useful background information relating to the chemical vapour deposition of diamond materials may be found in a special issue of the Journal of Physics: Condensed Matter, Vol. 21, No. 36 (2009) which is dedicated to diamond related technology. For example, the review article by R. S Balmer et al. gives a comprehensive overview of CVD diamond materials, technology and applications (see "Chemical vapour deposition synthetic diamond: materials, technology and applications" J. Phys.: Condensed Matter, Vol. 21, No. 36 (2009) 364221).

Being in the region where diamond is metastable compared to graphite, synthesis of diamond under CVD conditions is driven by surface kinetics and not bulk thermodynamics. Diamond synthesis by CVD is normally performed using a small fraction of carbon (typically <5%), typically in the form of methane although other carbon containing gases may be utilized, in an excess of molecular hydrogen. If molecular hydrogen is heated to temperatures in excess of 2000 K, there is a significant dissociation to atomic hydrogen. In the presence of a suitable substrate material, synthetic diamond material can be deposited.

Atomic hydrogen is essential to the process because it selectively etches off non-diamond carbon from the substrate such that diamond growth can occur. Various methods are available for heating carbon containing gas species and molecular hydrogen in order to generate the reactive carbon containing radicals and atomic hydrogen required for CVD diamond growth including arc-jet, hot filament, DC arc, oxy-acetylene flame, and microwave plasma.

Methods that involve electrodes, such as DC arc plasmas, can have disadvantages due to electrode erosion and incorporation of material into the diamond. Combustion methods avoid the electrode erosion problem but are reliant on relatively expensive feed gases that must be purified to levels consistent with high quality diamond growth. Also the temperature of the flame, even when combusting oxy-acetylene mixes, is insufficient to achieve a substantial fraction of atomic hydrogen in the gas stream and the methods rely on concentrating the flux of gas in a localized area to achieve reasonable growth rates. Perhaps the principal reason why combustion is not widely used for bulk diamond growth is the cost in terms of kWh of energy that can be extracted. Compared to electricity, high purity acetylene and oxygen are an expensive way to generate heat. Hot filament reactors while appearing superficially simple have the disadvantage of being restricted to use at lower gas pressures which are required to ensure relatively effective transport of their limited quantities of atomic hydrogen to a growth surface.

In light of the above, it has been found that microwave plasma is the most effective method for driving CVD diamond deposition in terms of the combination of power efficiency, growth rate, growth area, and purity of product which is obtainable.

A microwave plasma activated CVD diamond synthesis system typically comprises a plasma reactor vessel coupled both to a supply of source gases and to a microwave power source. The plasma reactor vessel is configured to form a resonance cavity supporting a standing microwave field. Source gases including a carbon source and molecular hydrogen are fed into the plasma reactor vessel and can be activated by the standing microwave field to form a plasma in high field regions. If a suitable substrate is provided in close proximity to the plasma, reactive carbon containing radicals can diffuse from the plasma to the substrate and be deposited thereon. Atomic hydrogen can also diffuse from the plasma to the substrate and selectively etch off non-diamond carbon from the substrate such that diamond growth can occur.

A range of possible microwave plasma reactors for synthetic diamond film growth using a CVD process are known in the art. Such reactors have a variety of different designs. Common features include: a plasma chamber; a substrate holder disposed in the plasma chamber; a microwave generator for forming the plasma; a coupling configuration for feeding microwaves from the microwave generator into the plasma chamber; a gas flow system for feeding process gases into the plasma chamber and removing them therefrom; and a temperature control system for controlling the temperature of a substrate on the substrate holder.

A useful overview article by Silva et al. summarizing various possible reactor designs is given in the previous mentioned Journal of Physics (see "Microwave engineering of plasma-assisted CVD reactors for diamond deposition" J. Phys.: Condens. Matter, Vol. 21, No. 36 (2009) 364202). This article identifies that from a purely electromagnetic standpoint, there are three main design criteria: (i) the choice of the resonant mode; (ii) the choice of the coupling structure (electric or magnetic); and (iii) the choice of dielectric window (shape and location).

Having regard to point (i), Silva et al. identify that circular transverse magnetic (TM) modes, and particularly $TM_{0mn}$ modes, are most suitable. In this notation, the first index number (here 0) indicates that the electric field structure is axisymmetric, which will yield a circular plasma. The indices m and n represent the number of nodes in the electric field in the radial and axial directions, respectively. Silva et al indicate that a number of different modes have been used in prior art reactors including: $TM_{011}$; $TM_{012}$; $TM_{013}$; $TM_{020}$; $TM_{022}$; $TM_{023}$; and $TM_{031}$.

Having regard to point (ii), Silva et al. identify that electric field (capacitive) coupling using an antenna is the most widely used and that magnetic (inductive) coupling is rarely used because of the limited power than can be coupled. That said, a commercially available IPLAS reactor is disclosed as using magnetic coupling to support a $TM_{012}$ mode.

Having regard to point (iii), Silva et al. describe that an essential element associated with both electric and magnetic coupling schemes is a dielectric window which is generally made of quartz and delimits a reduced pressure zone inside the cavity in which reactant gases are fed to form a plasma when excited by the electromagnetic field. It is described that the use of a quartz window allows a user to select a single electric field anti-node region (of maximum electric field) such that the plasma can be ignited only in this region and the formation of parasitic plasma at other electric field maxima within the chamber can be avoided. The quartz window is conventionally in the form of a bell-jar placed over the substrate on which deposition is to occur and around an electric field anti-node located adjacent the substrate. Other dielectric window configurations are also disclosed. For example, an ASTEX reactor is described which includes a dielectric window in the form of a plate located across the reactor chamber approximately at the cavity mid-plane while a second-generation ASTEX reactor is described as having a dielectric window in the form of a quartz tube which is not directly exposed to the plasma so as to give the reactor better power handling capabilities.

In addition, the article discloses various geometries of prior art reactor chambers including: a cylindrical chamber such as the MSU reactor which is designed to support a $TM_{012}$ mode, the ASTEX reactor which is designed to support a $TM_{013}$ mode, or LIMHP reactor designs supporting a $TM_{023}$ mode or a $TM_{022}$ mode; an ellipsoidal chamber such as the AIXTRON reactor; and other non-cylindrical chambers such as the second generation ASTEX reactor which has a central cylindrical component purported to support a $TM_{011}$ mode between the substrate holder and a top portion of the chamber and laterally extending side lobes supporting a $TM_{021}$ mode so that the chamber as a whole supports multiple modes. The second generation ASTEX reactor has only one $E_z$-field maximum in the upper part of the central section of the chamber which is the case for a $TM_{011}$ mode, but two $E_z$ maxima in its lower half, as expected for a $TM_{021}$ mode.

Having regard to the patent literature, U.S. Pat. No. 6,645,343 (Fraunhofer) discloses an example of a microwave plasma reactor configured for diamond film growth via a chemical vapour deposition process. The reactor described therein comprises a cylindrical plasma chamber with a substrate holder mounted on a base thereof. A cooling device is provided below the substrate holder for controlling the temperature of a substrate on the substrate holder. Furthermore, a gas inlet and a gas outlet are provided in the base of the plasma chamber for supplying and removing process gases. A microwave generator is coupled to the plasma chamber via a high-frequency coaxial line which is subdivided at its delivery end above the plasma chamber and directed at the periphery of the plasma chamber to an essentially ring-shaped microwave window in the form of a quartz ring. The invention as described in U.S. Pat. No. 6,645,343 focuses on the ring-shaped microwave window and discloses that the coupling of microwaves in the reactor chamber is distributed in circularly symmetric fashion over the entire ring surface of the microwave window. It is taught that because the coupling is distributed over a large surface, high microwave power levels can be coupled without high electric field intensities developing at the microwave window thus reducing the danger of window discharge.

As such, U.S. Pat. No. 6,645,343 addresses two of the three design criteria described by Silva et al. in their Journal of Physics article discussed previously, i.e., the choice of the coupling structure (magnetic) and the choice of dielectric window (ring-shaped dielectric widow located around the side wall of a cylindrical reactor chamber). U.S. Pat. No. 6,645,343 is silent as to what resonant mode the chamber should be design to support and what design criteria should be applied to the chamber in order to best support the desired resonance mode to achieve a uniform, stable, large area plasma across the surface of a large area substrate/holder for achieving uniform CVD diamond growth over large areas.

It light of the above discussion and the prior art mentioned therein, it will be evident that it is a well known aim in the field of CVD diamond synthesis to form a uniform, stable, large area plasma across the surface of a large area substrate/holder for achieving uniform CVD diamond growth over large areas and that many different plasma chamber designs and power coupling configurations have been proposed in the art for trying to achieve this goal. However, there is an on going need to improve upon the prior art arrangements in order to provide larger CVD growth areas, better uniformity, higher growth rates, better reproducibility, better power efficiency and/or lower production costs.

Following on from the aforementioned background information, the present applicant has previously filed a number of patent applications directed to microwave plasma activated CVD reactor hardware and CVD diamond synthesis methodology for achieving high quality, thick CVD diamond growth of both single crystal and polycrystalline CVD diamond materials over relatively large areas and relatively high growth rates. These patent applications include patent applications describing:

(i) certain aspects of the structure and geometry of the microwave plasma chamber (e.g. WO2012/084661 which describes the use of a compact $TM_{011}$ resonance mode plasma chamber configuration and WO2012/084657 which describes the provision of a plasma stabilizing annulus projecting from a side wall of the plasma chamber);

(ii) certain aspects of the microwave power coupling configuration (e.g. WO2012/084658 which describes a microwave power delivery system for supplying microwave power to a plurality of microwave plasma reactors and WO2012/084659 which describes a microwave coupling configuration comprising an annular dielectric window, a coaxial waveguide, and a waveguide plate comprising a plurality of apertures disposed in an annular configuration for coupling microwaves towards the plasma chamber);

(iii) certain aspects of the substrate preparation, geometry, and temperature control configurations within the microwave plasma chamber (e.g. WO2012/084655 which describes how to prepare, locate, and control substrate parameters within a microwave plasma reactor to achieve desirable electric field and temperature profiles); and (iv) certain aspects of the gas flow configuration and gas flow parameters within a microwave plasma chamber (e.g. WO2012/084661 which describes a microwave plasma reactor with a multi-nozzle gas inlet array having a desirable geometric configuration for achieving uniform diamond growth over large areas and WO2012/084656 which describes the use of high gas flow rates and injection of process gases with a desirable Reynolds number to achieving uniform doping of synthetic diamond material over large areas).

By providing a microwave plasma reactor incorporating the features as described in the above identified patent applications the present applicant has achieved high quality, thick CVD diamond growth of both single crystal and polycrystalline CVD diamond materials over relatively large areas and relatively high growth rates.

That said, there is still an on-going need to further improve upon prior art arrangements in order to provide larger CVD growth areas, better uniformity, higher growth rates, better reproducibility, better power efficiency and/or lower production costs. In developing next generation CVD microwave reactors for diamond synthesis, the present applicant has identified a number of potential problems with existing CVD microwave reactors:

(a) restricted deposition area;
(b) poor uniformity of deposition over the deposition area;
(c) poor uniformity of deposition on multiple discrete components, limiting the number of discrete components that can be coated at once;
(d) high total electrical power requirements; and
(e) cost (electrical/power costs being a significant part of the growth costs).

It is an aim of certain embodiments of the present invention to address one or more of these problems and provide a platform for next generation CVD microwave reactors for diamond synthesis.

SUMMARY OF INVENTION

According to a first aspect of the present invention there is provided a microwave plasma reactor for manufacturing synthetic diamond material via chemical vapour deposition, the microwave plasma reactor comprising:

a plasma chamber defining a resonant cavity for supporting a primary microwave resonance mode having a primary microwave resonance mode frequency f;
a plurality of microwave sources coupled to the plasma chamber for generating and feeding microwaves having a total microwave power $P_T$ into the plasma chamber;
a gas flow system for feeding process gases into the plasma chamber and removing them therefrom; and
a substrate holder disposed in the plasma chamber and comprising a supporting surface for supporting a substrate on which the synthetic diamond material is to be deposited in use,
wherein the plurality of microwave sources are configured to couple at least 30% of the total microwave power $P_T$ into the plasma chamber in the primary microwave resonance mode frequency f, and wherein at least some of the plurality of microwave sources are solid state microwave sources.

Three main types of such a microwave plasma reactor are envisaged:

(i) A configuration in which all, or at least the majority, of the microwave power is provided by solid state microwave sources directly coupled to the plasma chamber.
(ii) A configuration in which all, or at least the majority, of the microwave power is provided by solid state microwave sources and at least some of the solid state microwave sources are indirectly coupled to the plasma chamber via a separate pre-combination chamber which is coupled to the plasma chamber.
(iii) A configuration in which the majority of the total microwave power $P_T$ coupled into the plasma chamber is provided by a conventional microwave source, such as a magnetron, and additional solid state microwave sources are provided to tune or tailor the electric field and/or modify the plasma distribution within the plasma chamber.

According to a second aspect of the present invention there is provided a method of manufacturing synthetic diamond material using a chemical vapour deposition process, the method comprising:
providing a microwave plasma reactor as defined above;
locating a substrate over the substrate holder;
feeding microwaves into the plasma chamber;
feeding process gases into the plasma chamber; and
forming synthetic diamond material on the substrate.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION OF CERTAIN EMBODIMENTS

The present applicant has realized that one major contributor to the aforementioned problems is the use of a fixed, single frequency microwave source coupled to the plasma chamber. In this regard, it should be noted that existing microwave sources used for materials synthesis and processing, such as magnetrons, are typically both single frequency and fixed frequency. Furthermore, typically only one such microwave source is used per plasma chamber as the use of two or more conventional microwave sources coupled to a single plasma chamber leads to isolation problems.

Fixed, single frequency microwave sources are only typically available in permitted bands (due to legislation). This restricts the frequencies available for high power applications such as diamond synthesis. For example, there are two standard frequencies of microwave generator used in the UK: 2450 MHz and 896 MHz (in mainland Europe, the Americas and Asia, the lower frequency standard is 915 MHz, in Australia it is 922 MHz). Decreasing the frequency by a factor of 2.7 from 2450 MHz to 896 MHz allows a scale up in CVD deposition diameter of the order 2.7 for a given mode structure. Accordingly, the lower standard frequency is preferred for larger area deposition. The choice of other permitted bands, e.g. 433 MHz, is also possible. In some respects, a lower frequency of, for example, 433 MHz is advantageous for achieving even larger area CVD diamond deposition. Thus, decreasing the frequency by a factor of 2.07 from 896 MHz to 433 MHz will allow a scale up in CVD deposition diameter of the order of 2.07. However, it can be difficult to maintain a uniform, high power density plasma as required for high quality diamond synthesis at a frequency as low as 433 MHz. In practice, it would be desirable to be able to use a microwave frequency between 896 MHz and 433 MHz to enable an increase in deposition area while maintaining the ability to generate a uniform, high power density plasma suitable for high quality diamond synthesis as is currently possible operating at 896 MHz.

In addition to the above, the use of a single fixed frequency microwave source restricts the ability to tailor the electric field conditions within the plasma chamber, e.g. to achieve better uniformity over individual substrates in a multi-substrate process or to achieve better uniformity over a single large area substrate. Currently, to achieve a particular electric field profile within a plasma chamber using a single fixed frequency microwave source requires careful design and control of the position and shape of components disposed within the plasma chamber, e.g. internal chamber wall components and substrate size, position, and shape. However, it would be desirable to be able to directly drive a particular electric field profile rather than generating the profile using the internal geometry of the plasma chamber as this would reduce the criticality of the internal chamber wall components and substrate size, position, and shape and make the CVD process more robust and tunable during a synthesis process.

Following on from the above, the use of pulsed microwave systems may provide some benefits in tailoring uniformity. Furthermore, the use of pulsed microwave systems may also aid in driving gas dynamics (pressure pulses generated by rapidly fluctuating temperature) which could drive species to the growth surface and increase growth rate and/or improve material quality. Further still, whilst the electric field distribution is important in controlling plasma shape, for continuous plasmas the energy loss processes at the edge of the plasma also have a substantial effect, causing the plasma to 'ball up' to some extent over what might be expected from the electrical field distribution alone. Operating in a pulsed microwave mode may substantially reduce the overall power requirement. For these reasons, it may be advantageous to provide a pulsed microwave system. However, while pulsed microwave systems have been attempted, they are costly and generally have limited performance in terms of pulse rate and "off" level when constructed using a conventional magnetron microwave source (e.g. not switching "off" but merely switching to a lower "on" value).

An additional problem with the current single fixed frequency microwave systems is that if the microwave source fails then the entire synthesis process is lost and replacement of the single fixed frequency microwave source is expensive. Furthermore, existing single fixed frequency microwave sources, such as magnetrons, can be susceptible to failure. As such, it would be desirable to provide a system which gives higher synthesis run reliability and lower pre-emptive change-out costs.

Finally, a conventional microwave generator, magnetron head, and waveguide system forms a substantial portion of the footprint of an existing CVD microwave reactor. The elimination of these components would substantially reduce the footprint of the CVD microwave reactor and thus save on indirect costs.

The objective of embodiments of the present invention is to resolve all these limitations, whilst also retaining many of the benefits of a single mode chamber design. This is achieved by using a plurality of microwave sources coupled to the plasma chamber for generating and feeding microwaves having a total microwave power $P_T$ into the plasma chamber and configuring the plurality of microwave sources to couple at least 30%, 40%, 50%, 60%, 70%, 80%, 90%, or 95% of the total microwave power $P_T$ into the plasma chamber in a primary microwave resonance mode frequency f of the resonance cavity of the plasma chamber, wherein at least some of the plurality of microwave sources are solid state microwave sources. As such, as defined in the summary of invention section, there is provided a microwave plasma reactor for manufacturing synthetic diamond material via chemical vapour deposition, the microwave plasma reactor comprising:

a plasma chamber (comprising a base, a top plate, and a side wall extending from said base to said top plate) defining a resonant cavity for supporting a primary microwave resonance mode having a primary microwave resonance mode frequency f;

a plurality of microwave sources coupled to the plasma chamber for generating and feeding microwaves having a total microwave power $P_T$ into the plasma chamber;

a gas flow system for feeding process gases into the plasma chamber and removing them therefrom; and a substrate holder disposed in the plasma chamber and comprising a supporting surface for supporting a substrate on which the synthetic diamond material is to be deposited in use, wherein the plurality of microwave sources are configured to couple at least 30%, 40%, 50%, 60%, 70%, 80%, 90%, or 95% of the total microwave power $P_T$ into the plasma chamber in the primary microwave resonance mode frequency f, and wherein at least some of the plurality of microwave sources are solid state microwave sources.

Solid state microwave sources in the form of high power solid state microwave amplifiers are known in the art. Multiple devices may be combined into power modules which, in turn, may be combined to develop the required power. Such solid state microwave sources may be tuned such that the primary microwave resonance mode frequency f has a band width of no more than 10%, 5%, 3%, 1%, 0.5%, 0.3%, or 0.2% of a mean frequency value. As such, it will be understood that the primary microwave resonance mode frequency f isn't required to be a single value exactly corresponding to a theoretical value of a resonance mode as calculated from the dimensions of the resonant cavity but rather may be a frequency which deviates slightly from the theoretical value and may comprise a narrow band of frequencies. Furthermore, it will be understood that the primary resonance mode in the context of this invention is the mode into which the largest proportion of power is coupled and that this mode doesn't need to be the lowest frequency mode of the resonant cavity.

In relation to the above, it may be noted that the low power of individual solid state microwave sources has been seen as a dis-incentive to use such sources in high power, high quality CVD diamond synthesis applications. For example, "Microwave Synthesis: A Physical Concept, V. K. Saxena and Usha Chandra, University of Rajasthan, Jaipur, India" discloses various microwave sources and various applications for microwave sources. On page 4 it is disclosed that Magnetrons, Klystrons, Gyrotrons and Travelling wave tubes (TWT) are used to generate microwave power and that solid state devices are also used wherever low power microwaves are needed. CVD diamond synthesis is disclosed as an application for microwaves on page 19 of the paper. However, there is no suggestion that solid state microwave sources should be used for CVD diamond synthesis. In fact, this document teaches away from using solid state microwave sources for CVD diamond synthesis due to the disclosure that solid state sources are used wherever low power microwaves are needed while CVD diamond synthesis is a high power application.

Certain prior art disclosures have suggested using solid state microwave sources for microwave plasma synthesis and processing applications. However, where multiple sources/variable frequency solid state microwave sources are suggested in the prior art they are attached to chambers much larger than the operating wavelength of the solid state sources such that the microwave reactor configurations operate as multimode or near free space systems allowing techniques such as phased array steering, rather than coupling the majority of the microwave power into a single low order mode within a resonance cavity.

For example, EP0459177 describes a solid state microwave energized phased antenna array which is utilized as the excitation source for material/plasma processes. This phased antenna array is not coupled to a resonance cavity with the majority of the microwave power coupled into a primary microwave resonance mode of a resonance cavity for high power diamond synthesis applications. Rather, the phased array is coupled into a chamber much larger than the operating wavelength of the solid state microwave sources and the phased array is used to control the location of a power node within the chamber.

Similarly, U.S. Pat. No. 6,158,384 describes the use of a plurality of inductive antennas to generate a plasma within a processing chamber. Again, the antenna array is not coupled to a resonance cavity with the majority of the microwave power coupled into a primary microwave resonance mode of a resonance cavity for high power diamond synthesis applications.

U.S. Pat. No. 5,907,221 also discloses the use of a plurality of inductive antennas, this time to create a uniform ion density for substrate etching or CVD. Again, the antenna array is not coupled to a resonance cavity with the majority of the microwave power coupled into a primary microwave resonance mode of a resonance cavity for high power diamond synthesis applications.

U.S. Pat. No. 5,558,800 discloses the use of a plurality of solid state microwave sources in a microwave heating/oven application. This is not a plasma process and the microwave sources are run in order to avoid standing waves. This contrasts with the present invention in which a plurality of solid state microwave sources are coupled to a resonance cavity with the majority of the microwave power coupled into a primary microwave resonance mode of a resonance cavity for high power microwave plasma diamond synthesis applications.

EP0801879 describes excitation of a microwave cavity resonator using a single microwave source (vacuum-based rather than solid state), swept through a frequency range corresponding to a number of resonant modes within that chamber. This is done in order to produce a substantially uniform time-averaged power density. Again, this contrasts with the present invention in which a plurality of solid state microwave sources are coupled to a resonance cavity with the majority of the microwave power coupled into a primary microwave resonance mode of a resonance cavity for high power microwave plasma diamond synthesis applications.

U.S. Pat. No. 7,574,974 describes excitation of a uniform sheet plasma using multiple coaxial applicators imbedded in a chamber wall. Although it is concerned primarily with CVD diamond deposition it is considerably different to the configurations described herein in that the microwave sources are not coupled to a resonance cavity with the majority of the microwave power coupled into a primary microwave resonance mode of the resonance cavity. In fact, the configuration described in U.S. Pat. No. 7,574,974 is actually presented as an alternative method to the use of a microwave cavity resonator (the drawbacks of which are listed in the prior art section).

The above described prior art thus seem to teach away from the presently claimed microwave plasma reactor configuration in which a plurality of solid state microwave sources are coupled to a resonance cavity with the majority (or at least 30%) of the microwave power coupled into a primary microwave resonance mode of the resonance cavity. Furthermore, the present applicant considers that the presently described microwave plasma reactor configuration has several advantages over such prior art systems, particularly for very high power applications such as high power, high quality microwave plasma diamond synthesis as discussed below.

The presently described microwave plasma reactor configuration can be configured to operate in a similar manner to current resonance cavity systems which use a single, fixed frequency magnetron microwave source, e.g. at a permitted frequency of 896 MHz, but with the majority of the microwave power from the plurality of solid state microwave sources coupled into a primary microwave resonance mode at a frequency lower than that of a single, fixed frequency magnetron microwave source. For example, the presently described system can be configured to operate with a primary microwave resonance mode frequency f which is lower than 896 MHz by at least 10%, 20%, 30%, 40%, or 50%. The resonance cavity and the growth area are thus scaled in size according to 1/f. The operating frequency can be chosen to obtain an increase in growth area and associated product size without substantially adversely changing CVD chemistry issues or frequency dependent behaviour of the plasma for specific gas mixture, pressure and power parameter combinations optimized for particular growth processes.

In addition to the above, the use of a plurality of solid state microwave sources allows the ability to tailor the electric field conditions within the plasma chamber, e.g. to achieve better uniformity over individual substrates in a multi-substrate process or to achieve better uniformity over a single large area substrate. As previously described, currently to achieve a particular electric field profile within a plasma chamber using a single fixed frequency microwave source requires careful design and control of the position and shape of components disposed within the plasma chamber, e.g. internal chamber wall components and substrate size, position, and shape. In contrast, embodiments of the present invention can be configured to directly drive a particular electric field profile rather than generating the profile using the internal geometry of the plasma chamber. This reduces the criticality of the internal chamber wall components and substrate size, position, and shape and makes the CVD process more robust and tunable during a synthesis process. That is, the plurality of solid state microwave sources can be configured such that a majority of the microwave power is coupled into a primary microwave resonance mode of the resonance cavity and a minority of the microwave power can be coupled into the plasma chamber in one or more different frequencies to that of the primary microwave resonance mode to generate a desired electric field profile. For example, the plurality of solid state microwave sources can be configured such that a majority of the microwave power is coupled into a primary microwave resonance mode of the resonance cavity and less than 50%, 40%, or 30% but at least 1%, 2%, 3%, 5%, 10% or 20% of the total microwave power $P_T$ is coupled into the plasma chamber in one or more different frequencies to that of the primary microwave resonance mode. Such minor modes can be used to tune the electric field and plasma distribution within the plasma chamber to achieve better uniformity over individual substrates in a multi-substrate process or to achieve better uniformity over a single large area substrate.

For example, WO2012/084655 describes how to prepare, locate, and control substrate parameters within a microwave plasma reactor to achieve a desirable electric field profile. The present invention allows the generation of at least some of the desired electric field profile not by generating harmonics at the edges of the substrate but by deliberately introducing additional frequencies into the chamber at lower power than the dominant power frequency to directly drive a similar effect.

According to one configuration, one or more of the solid state microwave sources may be configured to be coupled to the plasma chamber through the substrate holder. A plurality of substrate holders may be provided for supporting a plurality of substrates on which synthetic diamond material is to be deposited and the solid state microwave sources may be configured to be coupled to the plasma chamber through the plurality of substrate holders.

One such application of the aforementioned technique is in a process using multiple metal mandrels, such as a speaker dome process as described in WO2013/178535. The provision of minor modes to tune the electric field and plasma distribution within the plasma chamber can be used to achieve better uniformity over individual substrates in such a multi-substrate process. In one configuration, the individual domes/mandrels can be used as antennae such that at least a portion of the microwave power is introduced into the plasma chamber via the domes themselves. This may have the effect of increasing the ability to tailor the plasma around the domes, e.g. further increasing the ability to go to smaller radii (higher breakup frequency) domes. Rather than introducing all the microwave power into the plasma chamber via the individual substrate, the majority of the microwave power can be introduced into the primary resonance mode of the chamber, and individual substrates can be driven sufficiently to give additional control on overall plasma conformity and to tailor the growth rate of one each substrate individually, improving uniformity across a plurality of substrates. In this latter configuration, the majority of the power may be the dominant power frequency, and the power fed to each dome may be at a different frequency to the dominant power frequency. The power and the frequency could then be tailored for each individual dome to provide the greatest control over uniformity.

Another advantage of embodiments of the present invention is that by using multiple microwave sources, if a microwave source fails during a run the whole of the synthesis run is not compromised but rather only a small yield loss may occur. In this regard, each individual solid state source may provide only a small fraction of the total microwave power $P_T$ such that the loss of a single microwave source does not lead to a catastrophic power loss or non-uniformity. For example, at least several of the plurality of solid state microwave sources may each be configured to generated no more than 10%, 5%, 3%, or 2% of the total microwave power $P_T$. Furthermore, at least 30%, 50%, 70% or 100% of the total microwave power $P_T$ may be provided by such solid state microwave sources. The microwave plasma reactor may comprise at least 5, 10, 20, 30 or 50 individual solid state microwave sources coupled to the plasma chamber, each of which provides a correspondingly small fraction of the overall power. Furthermore, each of the solid state microwave sources may be independently controllable in terms of frequency, phase, and/or amplitude.

In contrast, at present a magnetron failure results in the loss of an entire synthesis run. In addition, the process can be made more stable to noise and interruptions in the electrical power supply, and is free from magnetron anode faults which are an issue with magnetrons and can lead to run failure. The aforementioned features of embodiments of the present invention give both higher run reliability and lower pre-emptive change-out costs, adding substantially to the cost effectiveness of using a plurality of solid state sources. Solid state sources are in any event highly reliability units, whereas magnetrons have a very definite life cycle.

Furthermore, while the efficiency of a magnetron is high when run near full power, in many circumstances the system is not run under the most efficient conditions. With multiple solid state microwave sources, not only is efficiency less a function of output, but in addition lower power processes could simply use less microwave sources, with any additional microwave sources being turned off. It may also be noted that while solid state microwave sources are not cheaper than magnetron sources at this time, the trend is that their costs are reducing, whilst those for magnetron sources are increasing.

Additionally, a conventional microwave generator, magnetron head, and waveguide system forms a substantial portion of the footprint of an existing CVD microwave reactor. The elimination of these components substantially reduces the footprint of a CVD microwave reactor making the system more compact thus save on indirect costs.

Further still, using a plurality of solid state microwave sources allows the microwave power to be readily pulsed between off and on states. As previously indicated, while pulsed microwave systems have been attempted before, they are costly and generally have limited performance in terms of pulse rate and "off" level (e.g. not switching "off" but merely switching to a lower "on" value). Solid state sources can be truly switched off, something very difficult with typical industrial magnetron sources. They can also be pulsed on separate patterns, for example for microwave sources applied directly to the substrate or operating at different frequencies, or the pulsing can be phased along axial or circumferential sets of sources to give a form of stirring. Pulsing the solid state microwave sources can thus give several possible advantages:

(i) access to higher powers, avoiding electrical breakdown and arcing in the plasma;
(ii) stirring effects driven by phased sources;
(iii) gas pressure pulsing, generating gas stirring;
(iv) modification of the plasma shape to more closely conform to the electric field distribution, reducing the need for an electric field profile as described in WO2012/084655 for example and/or reducing the dependence of the electric field profile on the internal geometry of the plasma chamber; and
(v) reduction in overall process power, saving costs and also reducing service demands of reactors by, for example, improving the efficiency with which power is coupled through the substrate carrier and reducing power loss from the plasma to the side walls of the plasma chamber.

Pulsing the plurality of microwave sources can thus aid in tailoring uniformity, increase growth rate, improving material quality, and reducing the overall power requirement. Operate in pulsing mode may also be used as an alternative, or in addition, to high gas flows to drive gas dynamics as described in WO2012/084661 and WO2012/084656. The plurality of solid state microwave sources may be configured to pulse the microwave power coupled into the plasma chamber at a pulse frequency in a range 10 Hz to 1 MHz, 100

Hz to 1 MHz, or 1 kHz to 100 kHz. Furthermore, the pulsing may be different for different frequencies present.

Preferably, one, more or all of the solid state microwave sources are directly coupled to the plasma chamber. The solid state microwave sources are preferably magnetically coupled to the plasma chamber although electrical coupling is also envisaged. An example of a direct magnetic coupling uses a simple coaxial type N feed-through ending in a loop antenna. By design, solid state microwave sources are not adversely affected by reflected power from the plasma chamber and/or other microwave sources. As such, the system may be operated with all the power at the same frequency locked in phase, or may be deliberately run with multiple microwave sources out of phase or even at slightly different frequencies to randomise the phase, enabling efficient power transfer with lower peak fields. In this regard, it should also be noted that because a plurality of solid state microwave sources are utilized, each feeding microwave power into a resonant cavity plasma chamber, in order to efficiently combine the power of these solid state sources within the plasma chamber, it is important to be able to control the output phases of these sources relative to one another.

Figure 1:
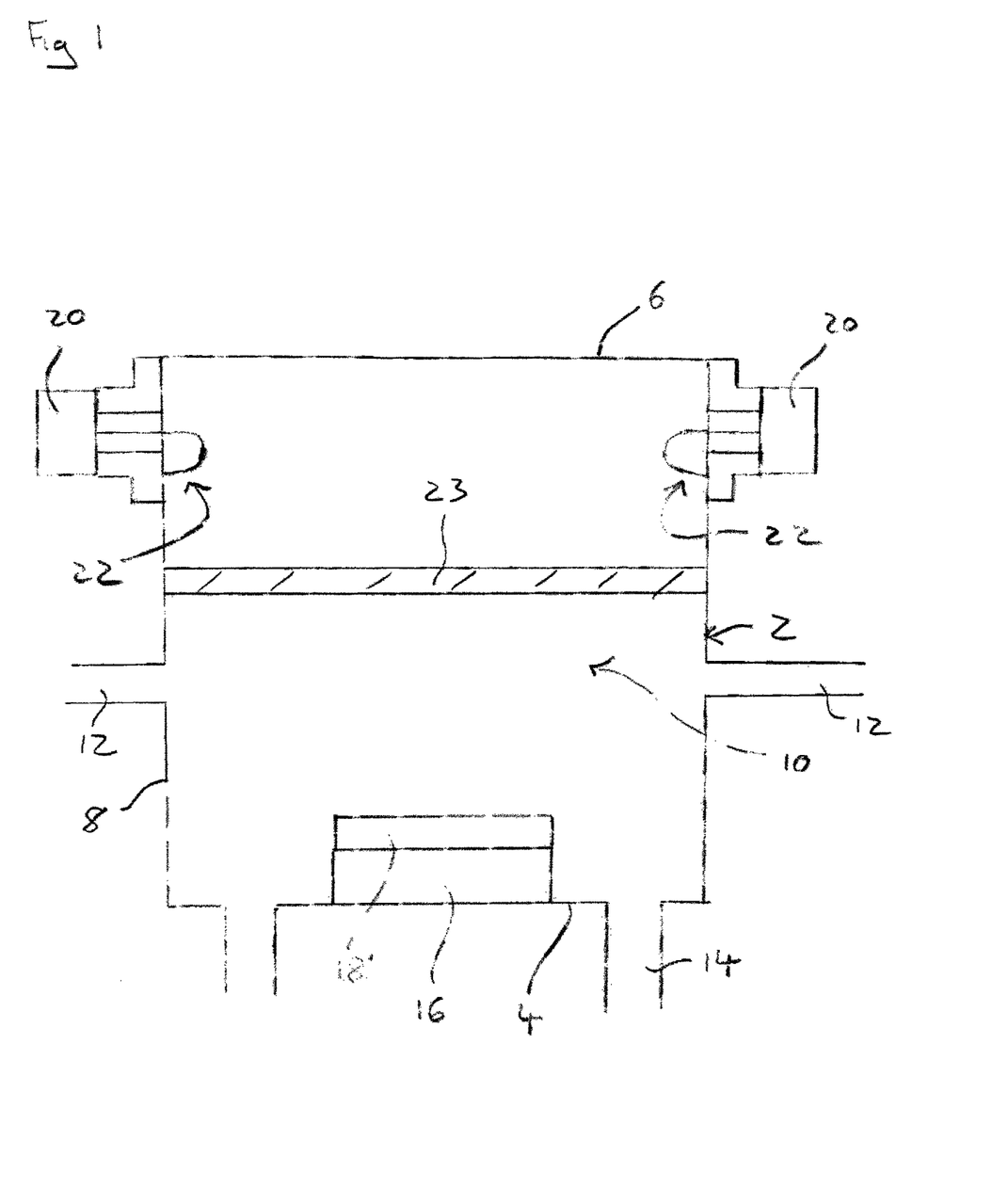
FIG. 1 shows a cross-sectional view of a microwave plasma reactor configured to deposit synthetic diamond material using a chemical vapour deposition technique in accordance with an embodiment of the present invention.

FIG. 1 shows a cross-sectional view of a microwave plasma reactor configured to deposit synthetic diamond material using a chemical vapour deposition technique in accordance with an embodiment of the present invention.

The microwave plasma reactor includes a plasma chamber 2 comprising a base 4, a top plate 6, and a side wall 8 extending from said base to said top plate defining a resonance cavity 10 for supporting a primary microwave resonance mode having a primary microwave resonance mode frequency f. In this regard, the plasma chamber 2 can include one or more of the design features as described in WO2012/084661. For example, the resonance cavity of the plasma chamber can be configured to support a $TM_{011}$ resonant mode at the primary microwave resonance mode frequency f.

The microwave plasma reactor further includes a gas flow system for feeding process gases into the plasma chamber via an inlet or inlets 12 and removing them therefrom via outlets 14. While side wall gas inlets 12 are illustrated in FIG. 1, an axially oriented, high velocity gas flow system can be provided as described in WO2012/084661 and WO2012/084656. A dielectric barrier 23 is provided for separating vacuum from non-vacuum regions of the chamber 2.

A substrate holder 16 is disposed in the plasma chamber and comprises a supporting surface for supporting a substrate 18 on which the synthetic diamond material is to be deposited in use.

Finally, and in accordance with embodiments of the present invention, a plurality of solid state microwave sources 20 are coupled to the plasma chamber 2 for generating and feeding microwaves having a total microwave power $P_T$ into the plasma chamber 2, wherein the plurality of solid state microwave sources 20 are configured to couple at least 50%, 60%, 70%, 80%, 90%, or 95% of the total microwave power $P_T$ into the plasma chamber in the primary microwave resonance mode frequency f of the plasma chamber 2. In the illustrates embodiment, a direct coupling is used in which each solid state microwave source 20 is magnetically coupled into the plasma chamber using a simple coaxial type N feed-through ending in a loop antenna 22.

In the illustrated embodiment, the plurality of solid state microwaves sources are coupled into the plasma chamber via an upper portion of the side wall of the chamber. The plurality of solid state microwaves sources are provided in a ring around the periphery of the side wall of the plasma chamber. However, other configurations are also envisaged. For example, the plurality of solid state microwaves sources may be coupled into the plasma chamber via the top plate or the base of the chamber. In some respects a top-plate coupling provided in a ring around a peripheral region of the top plate can provide a microwave coupling which is similar in some respects to the annular microwave inlet described in WO2012/084659.

In contrast to the above, rather than directly coupling the solid state microwave sources into the plasma chamber, one, more, or all of the solid state microwave sources may be configured to be indirectly coupled to the plasma chamber via a separate chamber or waveguide wherein one or more of the solid state microwave sources are pre-combined in the separate chamber or waveguide which is coupled to the plasma chamber.

Figure 2:
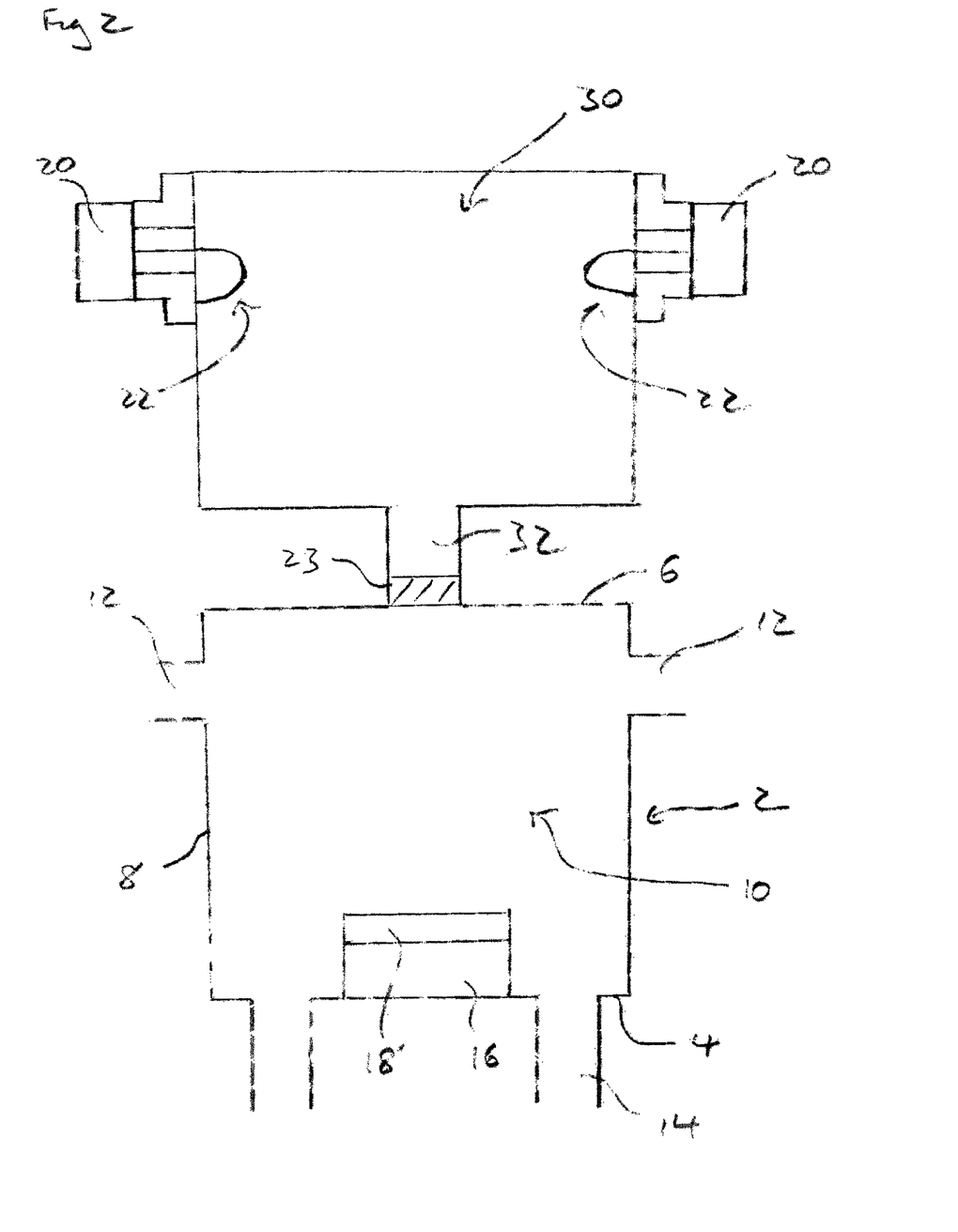
FIG. 2 shows a cross-sectional view of a microwave plasma reactor configured to deposit synthetic diamond material using a chemical vapour deposition technique in accordance with another embodiment of the present invention.

FIG. 2 shows a cross-sectional view of a microwave plasma reactor configured to deposit synthetic diamond material using a chemical vapour deposition technique in accordance with such an indirect coupling arrangement. The microwave plasma reactor includes a plasma chamber 2 comprising a base 4, a top plate 6, and a side wall 8 extending from said base to said top plate defining a resonance cavity 10 for supporting a primary microwave resonance mode having a primary microwave resonance mode frequency f. The microwave plasma reactor further includes a gas flow system for feeding process gases into the plasma chamber via inlets 12 and removing them therefrom via outlets 14. A substrate holder 16 is disposed in the plasma chamber 2 and comprises a supporting surface for supporting a substrate 18 on which the synthetic diamond material is to be deposited in use. In these respects, the microwave plasma reactor is similar to that illustrated in FIG. 1 and described previously. The difference here is that a separate chamber 30 is provided for combining microwaves from a plurality of solid state microwave sources 20 prior to feeding the microwaves into the resonance cavity 10 of the plasma chamber 2. The solid state microwave sources 20 are each coupled into this separate chamber 30 by, for example, a simple coaxial type N feed-through ending in a loop antenna 22. A coupling 32 is then provided between the chamber 30 and the resonance cavity 10 of the plasma chamber 2 for feeding microwaves into the plasma chamber 2. A dielectric barrier 23 is provided for separating vacuum from non-vacuum regions of the chambers.

The coupling 32 provided between the chamber 30 and the resonance cavity 10 is preferably a magnetic coupling although an electrical coupling is also envisaged. In one configuration the coupling 32 provided between the chamber 30 and the resonance cavity 10 can be arranged in a similar manner to the annular microwave inlet described in WO2012/084659. That is, the microwave coupling configuration for feeding microwaves from the chamber 30 into the resonance cavity 10 may comprise: an annular dielectric window formed in one or several sections; a coaxial waveguide having a central inner conductor and an outer conductor for feeding microwaves to the annular dielectric window; and a waveguide plate comprising a plurality of apertures disposed in an annular configuration with a plurality of arms extending between the apertures, each aperture forming a waveguide for coupling microwaves towards the plasma chamber, wherein the plurality of arms define one or more channels for supplying coolant and/or process gas, wherein the one or more channels comprise at least one channel configured to supply process gas to one or more injection ports arranged opposite the substrate holder for injecting process gas towards the substrate holder, wherein the waveguide plate comprises a central portion which extends across the plasma chamber and is supported by the plurality of arms extending between the apertures, and wherein the central inner conductor of the coaxial waveguide forms a floating conductor supported by the central portion of the waveguide plate.

In addition to the arrangements as described above which use solid state microwave sources in a direct or indirect coupling configuration, it is also possible to use a mixture of solid state microwave sources and a conventional microwave source such as a magnetron. For example, at least at least 30%, 40%, 50%, 60%, 70%, 80%, 90%, or 95% of the total microwave power $P_T$ coupled into the plasma chamber in the primary microwave resonance mode frequency f may be provided by a magnetron microwave source, e.g. using a coupling configuration as described in WO2012/084659. Additional solid state microwave sources can then be provided to tune or tailor the electric field and/or plasma distribution within the plasma chamber.

In yet another configuration, a conventional microwave source is replaced with a plurality of solid state microwave sources but in other respects the microwave plasma reactor design is similar to a conventional design. In such an arrangement, the solid state sources can be coupled into a waveguide which is coupled into the plasma chamber, e.g. using a coupling configuration as described in WO2012/084659. In such an arrangement the microwaves from the plurality of solid state sources may be combined using a co-axial waveguide.

In all the aforementioned configurations, a dielectric window 23 is provided at a position between the solid state microwave sources and the substrate holder. The exact position may be selected according to the particular reactor configuration. For example, an annular dielectric window may be provided in a similar manner to that described in WO2012/084659. Alternatively, a dielectric plate may be provided across the resonant cavity. Alternatively, still, individual dielectric windows may be provided for each solid state microwave source. Yet another alternative is to provide the dielectric window in the form of a bell jar over the substrate holder although it is preferred to locate the dielectric window or windows away from the substrate holder to prevent the plasma etching the dielectric in use.

Microwave plasma reactor systems as described herein can provide a synthesis/processing platform for high power microwave plasma applications. For example, a method of manufacturing synthetic diamond material using a chemical vapour deposition process can be providing, the method comprising: providing a microwave plasma reactor as described herein; locating a substrate over the substrate holder; feeding microwaves into the plasma chamber; feeding process gases into the plasma chamber; and forming synthetic diamond material on the substrate.

Applications
Diamond Speaker Domes

A process for fabricating diamond speaker domes using multiple metal mandrels is described in WO2013/178535. The number of speaker domes which can be fabricated in a single growth run is limited by the overall growth diameter of the plasma chamber. Furthermore, the radius of curvature of each dome cannot be reduced below a certain limit, leading to an increase in breakup frequency, without introducing significant non-uniformities in growth.

An alternative process using a solid state sources can be configured to operate at a microwave frequency of around 720-750 MHz (chosen as a 20% reduction from the standard 896 MHz operating frequency of a magnetron system to obtain size benefits without substantially changing chemistry issues or frequency dependent behaviour of the plasma), enabling one or both of:
 (i) an increased dome loading thus reducing the fabrication cost per dome; and
 (ii) a reduction in the radius of curvature of the domes enabling an increase in audio performance and break-up frequency.

The individual dome substrates can be used as antennae, thus introducing microwave power put into the chamber via the dome substrates themselves. This can have the effect of increasing the ability to tailor the plasma around the domes, e.g. further increasing the ability to go to smaller radii (higher break-up frequency) domes.

Rather than introducing all the microwave power into the plasma chamber via the individual substrate, the majority of the microwave power can be introduced into the primary resonance mode of the chamber, and individual substrates can be driven sufficiently to give additional control on overall plasma conformity and to tailor the growth rate of one each substrate individually, improving uniformity across a plurality of substrates. In this latter configuration, the majority of the power may be the dominant power frequency, and the power fed to each dome may be at a different frequency to the dominant power frequency. The power and the frequency could then be tailored for each individual dome to provide the greatest control over uniformity.

Conventional Flat Substrate Processes

In polycrystalline CVD diamond synthesis processes on a metal substrate, or single crystal CVD diamond synthesis processes where single crystal diamond substrates are mounted on a metal substrate, an electric field profile as described in WO2012/084655 may be advantageously provided by suitable design of the geometry of the substrate and its positioning in the plasma chamber. This approach effectively uses one form of non-uniformity to cancel out another form of non-uniformity within the plasma chamber. The problem is that near the edge of the plasma in steady state, the energy loss mechanisms (diffusion of energetic species out of the activated region) cause the plasma edge to shrink inwards. The higher edge field of the electric field profile overdrives these regions to try and counter this effect. In contrast, pulsing the plasma using multiple solid state microwave sources causes the plasma density profile to more closely follow the electric field distribution, and the use of multiple frequencies and varied pulsing profiles gives a very high level of control over the precise electric field distribution driving the plasma. This gives more uniform growth profiles over larger areas and with greater flexibility in the design of the metal substrate.

GaN-on-Diamond Processes

Processes for fabricating GaN-on-Diamond products are described in U.S. Pat. Nos. 7,595,507, 8,283,672, 8,283,189, and WO2013/087706. The processes involve growth of a CVD diamond layer on a substrate comprising a semiconductor such as a GaN epilayer structure. Providing a CVD diamond layer in close thermal contact to the GaN allows better thermal management of high power and/or high frequency devices. However, it is desired to decrease the cost of current 4 inch (10.16 centimetre) wafer processes by increasing diamond growth rates and translate such cost reduction processes to 6 inch (15.24 centimetre) wafer processes.

Solid state sources can assist with achieving both the aforementioned objectives. For 4 inch (10.16 centimetre) wafers the key is achieving high quality diamond at high growth rate, typically demanding relatively high power and pressure, whilst minimising the power through the substrate, the non-uniformity across the substrate, and any temporal variation of pressure uniformity on a scale which can generate additional thermal stresses (e.g. <100 Hz). Using solid state sources allows a lower operating frequency (e.g. 700 MHz) which improves uniformity for 4 inch (10.16 centimetre) wafers, while at the same time permitting high frequency pulsing to maximise growth rate and quality while minimising the power through the substrate, carefully tailoring the impact of the pressure fluctuations on the wafer (e.g. operating at sufficiently high pulse frequency for the wafer to not be able to respond, or not switching power to off but merely to a lower setting).

Current 4 inch (10.16 centimetre) wafer processes using a CVD reactor operating at a standard frequency of 896 MHz are capable of uniform growth on a flat substrate out to approximately 140 mm while providing space for jigging which controls the plasma uniformity. Such systems currently struggle to provide the level of uniformity needed to achieve the step up in growth rate required. On this basis, successful growth for 6 inch (15.24 centimetre) wafers may require a chamber capable of growth on a flat substrate out to 210 mm. Using solid state microwave sources at lower frequency will allow current chambers to be scaled up (e.g. at 66% frequency or 600 MHz the two systems could be similarly engineered from a microwave perspective), with the additional options of then using pulsing or mixed frequencies to improve uniformity.

While this invention has been particularly shown and described with reference to embodiments, it will be understood to those skilled in the art that various changes in form and detail may be made without departing from the scope of the invention as defined by the appending claims.

The invention claimed is:

1. A microwave plasma reactor for manufacturing synthetic diamond material via chemical vapour deposition, the microwave plasma reactor comprising:
    a plasma chamber defining a resonant cavity for supporting a primary microwave resonance mode having a primary microwave resonance mode frequency f;
    a plurality of microwave sources coupled to the plasma chamber for generating and feeding microwaves having a total microwave power $P_T$ into the plasma chamber;
    a gas flow system for feeding process gases into the plasma chamber and removing them therefrom; and
    a substrate holder disposed in the plasma chamber and comprising a supporting surface for supporting a substrate on which the synthetic diamond material is to be deposited in use,
    wherein the plurality of microwave sources are configured to couple at least 30% of the total microwave power $P_T$ into the plasma chamber in the primary microwave resonance mode frequency f, and wherein at least one of the plurality of microwave sources is a magnetron and at least some of the plurality of microwave sources are solid state microwave sources provided to tune or tailor an electric field within the plasma chamber.

2. A microwave plasma reactor according to claim 1, wherein the plurality of microwave sources are configured to couple at least 40%, 50%, 60%, 70%, 80%, 90%, or 95% of the total microwave power $P_T$ into the plasma chamber in the primary microwave resonance mode frequency f.

3. A microwave plasma reactor according to claim 1, wherein the primary microwave resonance mode frequency f has a band width of no more than 10%, 5%, 3%, 1%, 0.5%, 0.3%, or 0.2% of a mean frequency value.

4. A microwave plasma reactor according to claim 1, wherein the primary microwave resonance mode frequency f is lower than 896 MHz by at least 10%, 20%, 30%, 40%, or 50%.

5. A microwave plasma reactor according to claim 1, wherein at least at least 50%, 60%, 70%, 80%, 90%, or 95% of the total microwave power $P_T$ coupled into the plasma chamber in the primary microwave resonance mode frequency f is provided by the magnetron microwave source.

6. A microwave plasma reactor according to claim 1, where at least 5, 10, 20, 30 or 50 individual solid state microwave sources are coupled to the plasma chamber.

7. A microwave plasma reactor according to claim 1, where the solid state microwave sources are independently controllable.

8. A microwave plasma reactor according to claim 1, wherein the solid state microwave sources are configured to pulse the microwave power coupled into the plasma chamber.

9. A microwave plasma reactor according to claim 8, wherein the solid state microwave sources are configured to pulse the microwave power coupled into the plasma chamber at a pulse frequency in a range 10 Hz to 1 MHz, 100 Hz to 1 MHz, or 1 kHz to 100 kHz.

10. A microwave plasma reactor according to claim 1, wherein one or more of the solid state microwave sources are directly coupled to the plasma chamber.

11. A microwave plasma reactor according to claim 10, wherein said solid state microwave sources are magnetically coupled to the plasma chamber.

12. A microwave plasma reactor according to claim 11, wherein said solid state microwave sources are coupled into the plasma chamber using a coaxial feed through ending in a loop antenna.

13. A microwave plasma reactor according to claim 1, wherein one or more of the solid state microwave sources are configured to be indirectly coupled to the plasma chamber via a separate chamber wherein microwaves supplied from the one or more of the solid state microwave sources are pre-combined in the separate chamber which is coupled to the plasma chamber.

14. A microwave plasma reactor according to claim 1, wherein the resonance cavity of the plasma chamber is configured to support a $TM_{0ii}$ resonant mode at the primary microwave resonance mode frequency f.

15. A method of manufacturing synthetic diamond material using a chemical vapour deposition process, the method comprising:
    providing a microwave plasma reactor according to claim 1;
    locating a substrate over the substrate holder;
    feeding microwaves into the plasma chamber;
    feeding process gases into the plasma chamber; and
    forming synthetic diamond material on the substrate.

* * * * *